United States Patent
Arnolds et al.

[11] Patent Number: 5,424,601
[45] Date of Patent: Jun. 13, 1995

[54] TEMPERATURE STABILIZED CRYSTAL OSCILLATOR

[75] Inventors: Gustaaf E. Arnolds; Jan W. Ooijman, both of Doetinchem, Netherlands

[73] Assignee: U.S. Philips Corporation, New York, N.Y.

[21] Appl. No.: 728,921

[22] Filed: Jul. 12, 1991

[30] Foreign Application Priority Data

Aug. 3, 1990 [EP] European Pat. Off. ............ 90202116

[51] Int. Cl.6 .................... H03B 5/32; H01L 41/08
[52] U.S. Cl. .................... 310/315; 310/312; 310/346
[58] Field of Search .............. 310/312, 346, 315; 331/176

[56] References Cited

U.S. PATENT DOCUMENTS

| | | | |
|---|---|---|---|
| 1,840,580 | 1/1932 | Heising | 310/315 |
| 1,915,368 | 6/1933 | Lach | 310/315 |
| 2,967,957 | 1/1961 | Massa | 310/324 |
| 3,322,981 | 5/1967 | Brenig | 310/315 |
| 3,404,298 | 10/1968 | Roberts | 310/315 |
| 3,414,794 | 12/1968 | Wood | 310/315 |
| 3,457,529 | 7/1969 | Merdian | 310/346 |
| 3,463,945 | 8/1969 | Fewings | 310/315 |
| 3,890,513 | 6/1975 | Barleen et al. | 310/324 |
| 3,978,432 | 8/1976 | Onoe | 333/162 |
| 4,608,506 | 8/1986 | Tanuma | 310/315 |

FOREIGN PATENT DOCUMENTS

| | | | |
|---|---|---|---|
| 1766435 | 6/1977 | Germany | H03B 5/04 |
| 0452404 | 9/1966 | Japan | 331/176 |
| 294061 | 7/1928 | United Kingdom | . |
| 1450237 | 9/1976 | United Kingdom | 331/176 |

OTHER PUBLICATIONS

Funkschau, OS 83, Helf 4, 1963, p. 216, Author unknown.

*Primary Examiner*—Thomas M. Dougherty
*Attorney, Agent, or Firm*—Bernard Franzblau

[57] ABSTRACT

An electronic circuit including a frequency-selective part including a piezoelectric crystal and an inductance; The crystal is shaped relative to its crystal axes in such a way that its temperature coefficient and the temperature coefficient of the inductance have opposite signs in order to reduce the influence temperature on the pulling range of the frequency-selective part of the circuit.

2 Claims, 1 Drawing Sheet

TEMPERATURE STABILIZED CRYSTAL OSCILLATOR

FIELD OF THE INVENTION

This invention relates to an electronic circuit including a frequency-selective part comprising piezo-electric crystal and an inductance. The inductance usually is provided in order to improve the pulling behaviour of the circuit (e.g. an oscillator), that is, its controllability within a predetermined frequency range.

BACKGROUND OF THE INVENTION

Such an electronic circuit is known, for instance, from Funkschau Os 83, Heft 4, 1963, page 216. The known electronic circuit is an oscillator with the frequency selective pan incorporating a series arrangement of a crystal and a variable inductance for the pulling of the crystal frequency.

Although the pulling aspect of the circuit is improved by inserting an inductance, there is another aspect, the dependence of the circuit fequency on the temperature, deteriorates considerably because the dependence of the circuit frequency the inductance introduces unfavourable influences. It is known, from DE-A 17 66 435, to compensate for the temperature behaviour of the crystal-oscillator by applying a d.c. current through an inductance in series with the crystal, which d.c. current is temperatue dependent. In this known oscillator a temperatue dependent current source is necessary in which the output is derived from the value of a temperature dependent resistor as a temperature sensor. Therefore, it is an object of the invention to provide an electronic circuit of the kind set forth wherein the inductance's influence on the temperature dependence of the frequency is considerably reduced, and without the use of a temperature sensor and/or other circuitry to generate a temperature-dependent electrical parameter to compensate for the temperature dependence of the crystal.

SUMMARY OF THE INVENTION

To this end an electronic circuit according to the invention is characterized in that the crystal has been shaped relative to its crystal axes in such a way that its temperature coefficient and the temperature coefficient of the inductance have opposite signs.

The invention is based on the insight that the temperature coefficient of the crystal depends on the shape of the with respect to its crystal axes. That is, the crystal temperature dependence of the crystal frequency is controllable by shaping the crystal slab by cutting or sawing according to predetermined directions with respect to its crystal structure. By selecting such orientations that the crystal and the inductance have mutually opposite signed temperature coefficients of preferably the same magnitude, the temperature dependencies cancel out. As a consequence, the need for additional control circuitry is obviated in this way. The electronic circuit may be a crystal oscillator or a crystal filter. The inductance and the crystal may appear for instance as a parallel or a series arrangement.

It should be noted that the term "crystal" referred to hereinabove is also meant to include ceramic material, for example, lithiumniobate, that also possesses the property of piezo-electricity, as does the piezo-electric crystal.

BRIEF DESCRIPTION OF THE DRAWINGS

The invention will be explained by way of example and with reference to the accompanying drawing, wherein.

DESCRIPTION OF THE PREFERRED EMBODIMENTS

Figure 1:
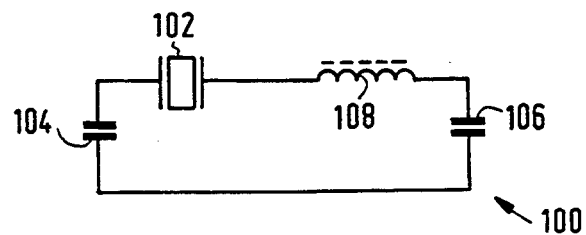
FIG. 1 shows a diagrammatic example of essential pans of a crystal oscillator with an inductance.

In FIG. 1 a diagrammatic example is shown of the essential parts of a crystal oscillator. The part 100 comprises, as frequency selective elements, a piezo-electric crystal 102; for example, a natural or artificial quartz-crystal, two capacitances 104 and 106 and an inductance 108. A material is said to be piezoelectric if it generates an electrical potential when it is mechanically deformed. Conversely, when a voltage is applied across the faces of a piezo-electric crystal the crystal will deform in a precise and predictable way. Associated with each crystal is a resonant frequency that depends on the dimensions of the crystal. Its piezo-electric property causes it to produce an AC voltage at the resonant frequency. It is that signal that is amplified and fed back to sustain oscillation. In general, crystal oscillators have very small temperature coefficients within the desired temperature range.

In order to pull the frequency, that is, in order to controllably vary the resonant frequency of the frequency selective part 100 over a considerable range, usually as inductance 108 is provided. The insertion of an inductance 108, however, entails a detrimental effect on the temperature stability of the resonant frequency of the frequency selective part 100 due to the temperature-dependence of the inductance. Reference circuitry (not shown) coupled to the frequency selective part for control purposes is one of the possible measures to stabilize the temperature dependency, but at the cost of adding more components. In an alternative embodiment the crystal and the inductance are placed in parallel.

The invention pursues another course which is based on the insight that the temperature coefficient of the crystal depends on the way it is cut or grown with respect to its crystal axes. This will be explained with reference to FIG. 2.

DIAGRAM WITH RELEVANT PARAMETERS

Figure 2:
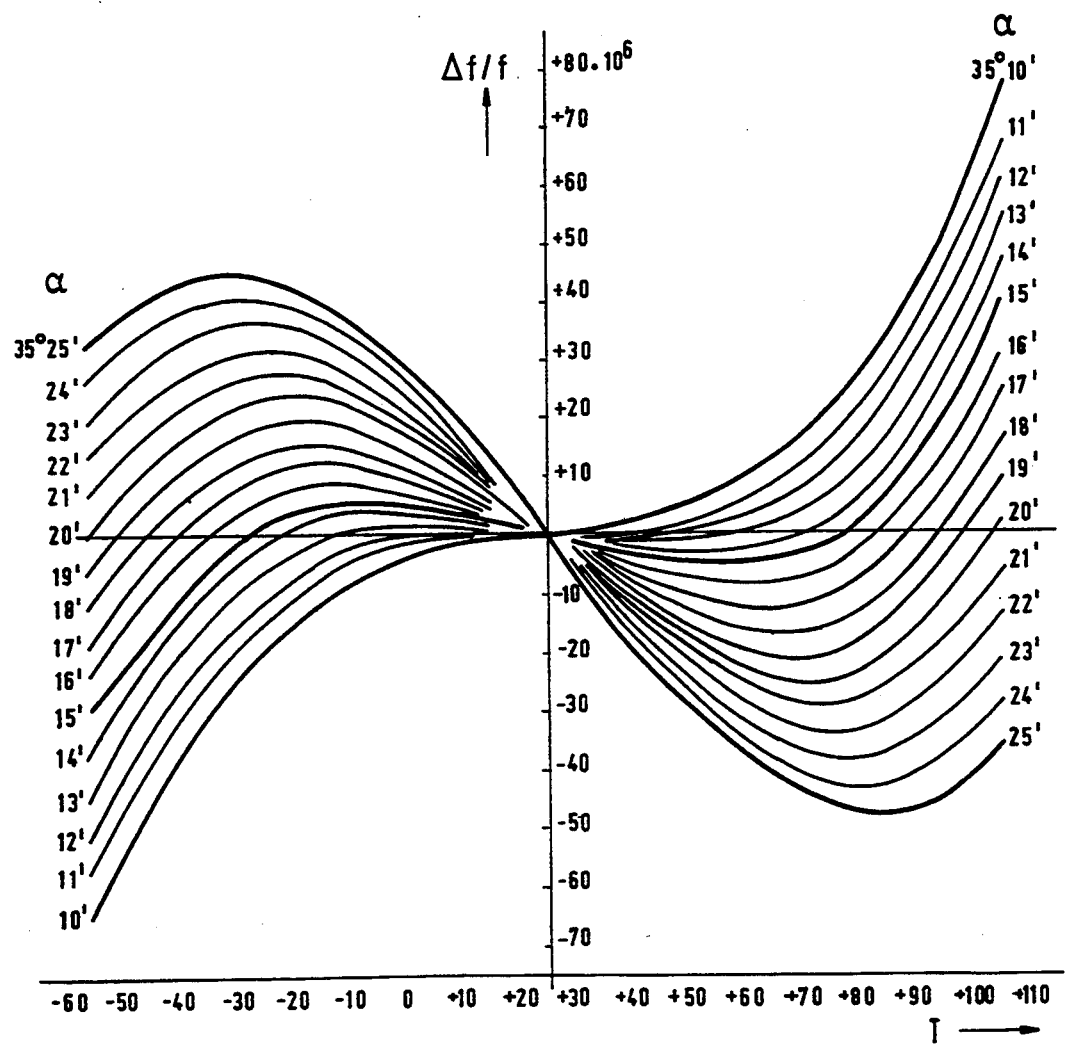
FIG. 2 shows a characteristic diagram visualizing the interdependence of frequency, temperature and cutting angle.

In FIG. 2 a characteristic example of a diagram is shown, visualizing the dependence of a relative frequency variation $\Delta f/f$ on the temperature T and a cutting angle $\alpha$. Such diagrams are obtained by determining the orientation of the crystal axes, e.g. by means of X-ray diffraction, for thereupon determining the angle under which the crystal is to be cut or saved. Then, for each angle the dependence of the relative frequency variation $\Delta f/f$ with temperature is measured.

As can be viewed in the diagram, for scaling the phenomenon the order of magnitude of the variation $\Delta f/f$ is $10^{-5}$, the order of magnitude of the temperature is 10 degrees Celsius and the order of magnitude of the cutting angle is 1 minute of arc.

Thus, for an inductance within the shown parameter area, a cutting angle can be selected for eventually producing a temperature stabilized combination of a crystal and an inductance for use in an oscillator or a filter according to the invention.

We claim:

1. An electronic circuit including a frequency-selective part comprising a piezo-electric crystal and an inductance, characterized in that the crystal is shaped relative to its crystal axes in such a way that the shaped crystal and the inductance have temperature coefficients for the oscillation frequency of the frequency-selective part which are opposite in sign and substantially cancel out each other, and wherein said frequency-selective part further comprises at least one capacitor connected in series circuit with said piezo-electric crystal and said inductance.

2. An electronic circuit comprising:

a frequency-selective circuit having a given oscillation frequency and including a piezoelectric crystal and an inductance element having a given temperature coefficient, and wherein the piezoelectric crystal is shaped relative to its crystal axis axes in a manner such that the temperature coefficient of the shaped piezoelectric crystal is opposite in sign to said given temperature coefficient of the inductance element thereby to compensate any temperature dependency of the oscillation frequency of the frequency selective circuit caused by said given temperature coefficient of the inductance element, wherein the temperature coefficient of the piezoelectric crystal is substantially equal and opposite to the temperature coefficient of the inductance element, and said frequency-selective circuit further comprises at least one capacitor connected in series circuit with said piezoelectric crystal and said inductance element.

* * * * *